United States Patent
Brown et al.

(10) Patent No.: US 6,558,471 B2
(45) Date of Patent: May 6, 2003

(54) SCRUBBER OPERATION

(75) Inventors: Brian J. Brown, Palo Alto, CA (US); Yufei Chen, San Jose, CA (US); David G. Andeen, Los Gatos, CA (US); Madhavi Chandrachood, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/771,087

(22) Filed: Jan. 26, 2001

(65) Prior Publication Data

US 2001/0035197 A1 Nov. 1, 2001

Related U.S. Application Data

(60) Provisional application No. 60/178,607, filed on Jan. 28, 2000.

(51) Int. Cl.$^7$ .............. B08B 1/00; B08B 3/04
(52) U.S. Cl. .............. 134/6; 134/3; 134/33; 15/77; 15/102

(58) Field of Search .............. 134/3, 6, 41, 33; 15/77, 102

(56) References Cited

U.S. PATENT DOCUMENTS

| 5,518,552 A | * | 5/1996 | Tanoue et al. | 134/1 |
| 6,110,294 A | * | 8/2000 | Shipley et al. | 134/6 |

* cited by examiner

*Primary Examiner*—Zeinabg El-Arini
(74) *Attorney, Agent, or Firm*—Dugan & Dugan

(57) ABSTRACT

Methods and apparatuses are provided that remove a scrubber brush from contact with a wafer surface prior to slowing down the scrubber brush's rotational rate. The scrubbing method may include rotating a scrubber brush at a non-reduced rate, while the scrubber brush is in contact with the wafer and removing the scrubber brush from contact with the wafer while rotating the scrubber brush at the non-reduced rate. The scrubbing apparatus has a controller programmed to perform the scrubbing method.

15 Claims, 4 Drawing Sheets

SCRUBBER OPERATION

This application claims priority from U.S. Provisional Patent Application Serial No. 60/178,607, filed Jan. 28, 2000, which is hereby incorporated by reference herein in its entirety.

FIELD OF THE INVENTION

The present invention relates to apparatuses and methods adapted to scrub thin substrates or wafers such as semiconductor wafers, compact discs, glass substrates, and the like. More particularly, the present invention relates to the rotational rate of a scrubber brush.

BACKGROUND OF THE INVENTION

During formation of a semiconductor device, various layers (e.g. oxides) require planarization to remove steps or undulations prior to formation of subsequent layers. Planarization is typically performed mechanically by forcing a semiconductor wafer face down against a semi-porous polishing pad which is saturated with an abrasive compound (i.e., a slurry) and by rotating the polishing pad relative to the semiconductor wafer. The slurry reacts with the wafer's surface, which makes the surface easier to remove, and the rotary motion between the polishing pad and the wafer mechanically removes layers of the intermediate oxide and is continued until the oxide steps or undulations are removed.

After polishing, slurry residue is conventionally cleaned or scrubbed from the wafer surfaces via mechanical scrubbing devices, which may employ polyvinyl acetate (PVA) brushes, brushes made from other porous or sponge-like material, or brushes made with nylon bristles, etc. Although conventional scrubbing devices may remove the majority of slurry and other particulates from a wafer's surfaces, some residual slurry and particulates may remain following wafer scrubbing and streaks may be found on the wafer's surface.

Accordingly, a need remains for an improved method and apparatus adapted to clean semiconductor wafers (and other similar substrates).

SUMMARY OF THE INVENTION

The present inventors have discovered that streaking and particle generation occurs when, after cleaning is complete, a scrubber brush's rotational speed is slowed while the scrubber brush is in contact with the wafer. Such reduction in speed is conventionally employed to reduce fluid spray/splashing that may otherwise occur due to the scrubber brush's higher rotational speed. Such spray and splashing is undesirable because the scrubber enclosure door conventionally opens (allowing wafer handler entry) before the scrubber brush is removed from the wafer's surface and thus allows wafer extraction to occur more quickly. The open door may allow fluid spray to exit the scrubber chamber.

Accordingly, the present invention provides methods and apparatuses that may remove slurry residue and other particles from a wafer's surface more effectively than does a conventional scrubber device. In a first aspect, the inventive method may comprise rotating a scrubber brush at a non-reduced rate, while the scrubber brush is in contact with the wafer, and removing the scrubber brush from contact with the wafer while rotating the scrubber brush at the non-reduced rate. It will be understood that the non-reduced rate is a rate employed to clean the wafer, and that the non-reduced rate is not a slower or reduced rate such as conventionally employed prior to removing a scrubber brush from contact with a wafer.

In a second aspect, the inventive method may comprise providing a scrubber brush adapted to scrub a wafer, rotating the scrubber brush at a non-reduced rate, while the scrubber brush is in contact with the wafer, removing the scrubber brush from contact with the wafer while rotating the scrubber brush at the non-reduced rate, and slowing the rotation of the scrubber brush from the non-reduced rate to a second rate after removing the scrubber brush from contact with the wafer while simultaneously or subsequently opening the scrubber's enclosure door.

The inventive apparatus comprises a mechanism adapted to support a wafer, a scrubber brush adapted to contact a wafer supported by the wafer supporting mechanism, a motor adapted to rotate the scrubber brush, a mechanism adapted to move the scrubber brush into and out of contact with a wafer supported by the wafer supporting mechanism, and a controller coupled to the motor and to the mechanism adapted to move the scrubber brush. The controller contains a program adapted to perform the following steps: rotating the scrubber brush at a non-reduced rate while the scrubber brush is in contact with the wafer, and removing the scrubber brush from contact with the wafer while rotating the scrubber brush at the non-reduced rate. In one aspect, the scrubber brush rotates only at the non-reduced rate when in contact with the wafer. In a further aspect the apparatus may also comprise a chamber enclosure having a door, and the controller program may be adapted to slow the scrubber brush's rotational rate after the scrubber brush is removed from contact with the wafer, while simultaneously or subsequently opening the chamber door.

Other features and advantages of the present invention will become more fully apparent from the following detailed description of the preferred embodiments, the appended claims and the accompanying drawings.

DETAILED DESCRIPTION OF THE PREFERRED EMBODIMENTS

An inventive scrubbing method and apparatus is provided that may reduce or eliminate a source of the streaking and/or particles experienced by conventional scrubber devices. The present inventors have discovered that the conventional methods which reduced scrubber brush rotational speed while the scrubber brush is in contact with a wafer being scrubbed (e.g. reduced speed prior to removing the scrubber brush from contact with the wafer), provide a source of the streaking and/or particles experienced by conventional scrubbers. Particularly, such streaking and particle generation readily occurs when an acidic cleaning solution is employed. Accordingly, an inventive scrubbing method and apparatus is provided that removes a scrubber brush from contact with the wafer prior to slowing the scrubber brush's rotational rate.

Figure 1:
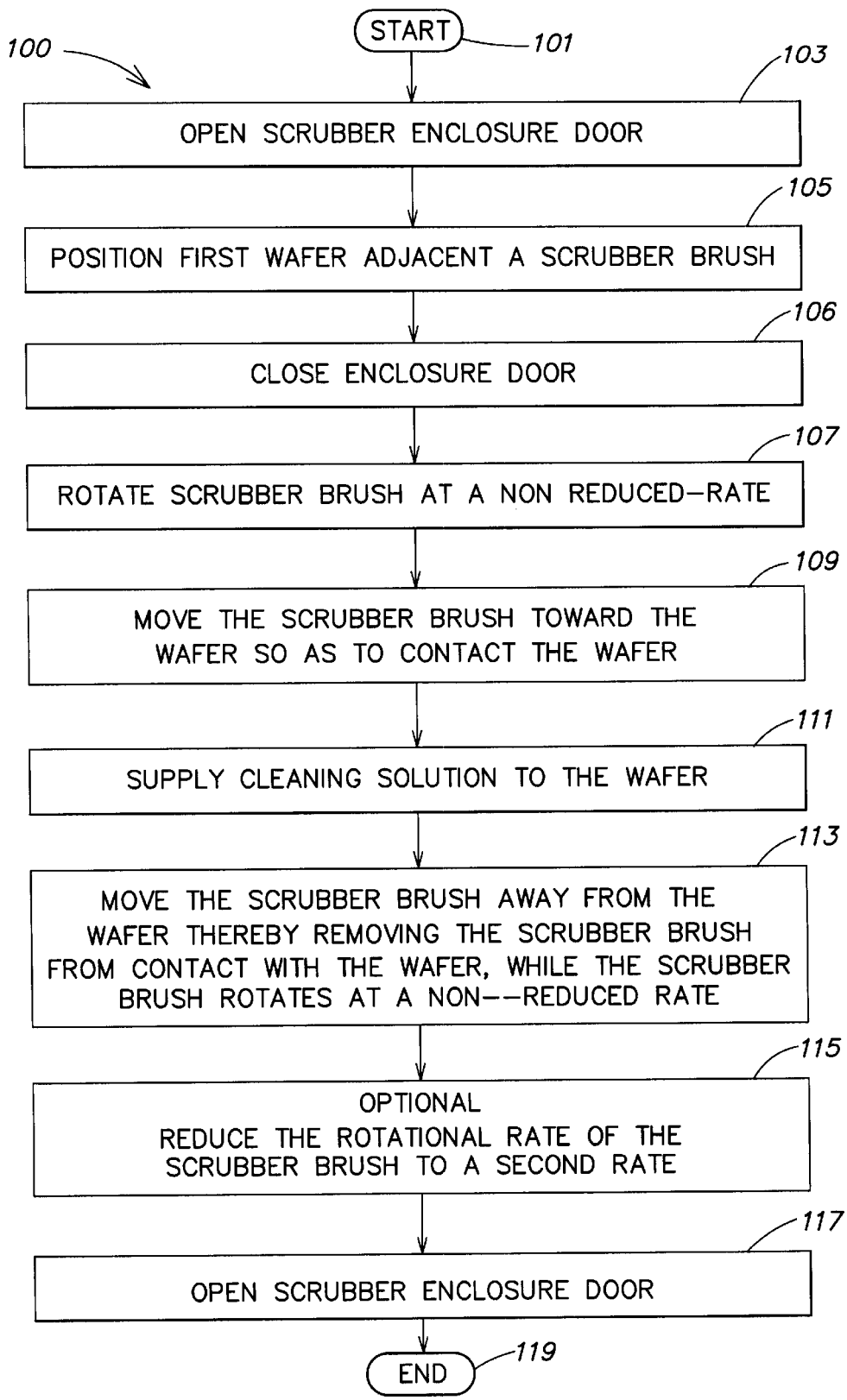
FIG. 1 is a flowchart of an inventive scrubbing method that may be employed in any conventional scrubber device.

FIG. 1 is a flowchart of an inventive scrubbing method 100 that may be employed in any conventional scrubber device whether a single or double sided scrubber, whether horizontally or vertically oriented, and regardless of the brush material. The inventive scrubbing method 100 may operate according to the following process.

Referring to the flowchart of FIG. 1, the inventive scrubbing method 100 starts at step 101. The scrubber brush may be in position so that a wafer may be placed on a wafer support of the scrubber device. The initial rotational rate of the scrubber brush may vary as described below. For example, the initial rotational rate of the scrubber brush may be either zero, a slow rate (e.g., 120 rpm), or a first rate (e.g., 400 rpm). In step 103, a door, which encloses the scrubber device, opens and thereafter in step 105, the wafer is positioned on the wafer support and is therefore adjacent the scrubber brush. In step 106, the scrubber enclosure door closes so as to prevent fluid from spraying outside the scrubber device. In step 107, the rotational rate of the scrubber brush may increase from the slow rate to the first rate. Alternatively, depending on the initial rotational rate of the scrubber brush, the scrubber brush may begin to rotate at the first rate or continue to rotate at the first rate in step 107. In step 109, the scrubber brush moves toward the wafer so as to contact the wafer. It will be understood that steps 107–109 may be reversed and that the scrubber brush may begin to rotate at the first rate after the scrubber brush contacts the wafer. In one aspect, however, the scrubber brush may rotate only at the first rate when in contact with the wafer.

In step 111, as the scrubber brush rotates, a fluid such as deionized water or a cleaning solution may be supplied to the wafer (e.g., directly or through the scrubber brush) to aid in removal of slurry residue. In step 113, after the wafer is cleaned, the scrubber brush moves away from the wafer, thereby removing the scrubber brush from contact with the wafer, while the scrubber brush rotates at a non-reduced rate. As previously stated, it will be understood that a non-reduced rate is a rate employed to clean the wafer, and that a non-reduced rate is not a slower or reduced rate such as conventionally employed prior to removing a scrubber brush from contact with a wafer. Recall that conventionally, the scrubber brush's rotational speed is slowed, while the scrubber brush remains in contact with the wafer. The inventors have found that removing the scrubber brush from contact with the wafer while rotating the scrubber brush at a non-reduced rate may allow the scrubber brush to move out of contact with the wafer without creating streaks and particles. As previously stated, in one aspect, the scrubber brush may rotate at the same rate (e.g., the first rate) whenever the scrubber brush is in contact with the wafer.

After the scrubber brush is no longer contacting the wafer, the rotational rate of the scrubber brush optionally may be reduced to a slower rate (e.g., 120 rpm) in step 115. Alternatively, the scrubber brush may continue to rotate at the non-reduced rate or the rotational rate of the scrubber brush optionally may be reduced to zero. The slow rate may be sufficiently reduced so as to reduce and eliminate instances of fluid spray/splashing outwardly from the scrubber brush (e.g., due to centripetal force). The reduced rate may thus prevent fluid from spraying outside the scrubber enclosure when the scrubber enclosure door opens. In step 117, the scrubber enclosure door opens, which allows a wafer handler's end effector to enter therethrough and extract the clean wafer. Thereafter, in step 119, the process ends. The process described above repeats as each wafer within a wafer carrier is processed.

Figure 2:
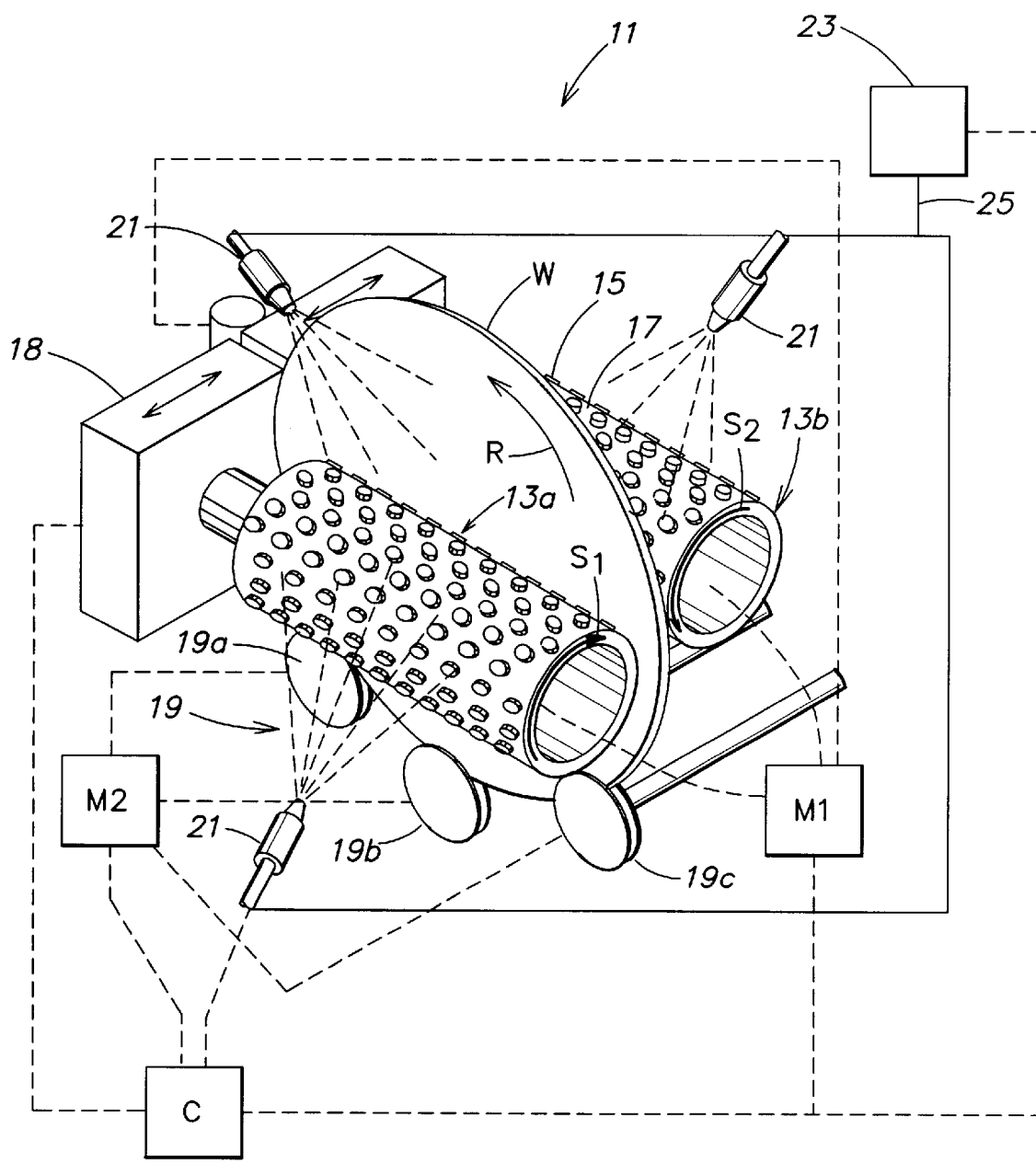
FIG. 2 is a side perspective view of an inventive scrubbing device that may perform the inventive scrubbing method.

FIG. 2 is a side perspective view of one embodiment of an inventive scrubbing device 11 that may perform the inventive scrubbing method 100. The inventive scrubbing device 11 comprises a pair of PVA brushes 13a, 13b. Each brush comprises a plurality of raised nodules 15 across the surface thereof, and a plurality of valleys 17 located among the nodules 15. The PVA brushes 13a, 13b are supported by a pivotal mounting (represented generally by reference number 18) adapted to move the PVA brushes 13a, 13b into and out of contact with the wafer W supported by the wafer support 19, thus allowing the PVA brushes 13a, 13b to move between closed and open positions so as to allow a wafer W to be extracted from and inserted therebetween as described below.

The scrubber device 11 also comprises a wafer support 19 adapted to support and further adapted to rotate a wafer W. In one aspect, the wafer support 19 may comprise a plurality of rollers 19a–c each having a groove adapted to support the wafer W vertically. A first motor M is coupled to the PVA brushes 13a, 13b and adapted to rotate the PVA brushes 13a, 13b. A second motor M2 is coupled to the rollers 19a–c and adapted to rotate the rollers 19a c.

The scrubbing device 11 may further comprise a plurality of spray nozzles 21 coupled to a source 23 of fluid via a supply pipe 25. The spray nozzles 21 may be positioned to spray a fluid (e.g., deionized water, SC1, dilute hydrofluoric acid, Electraclean, or any other liquid solution used for cleaning) at the surfaces of the wafer W or at the PVA brushes 13a, 13b during wafer scrubbing. Alternatively or additionally fluid may be supplied through the scrubber brushes themselves as is conventionally known.

Figure 3:
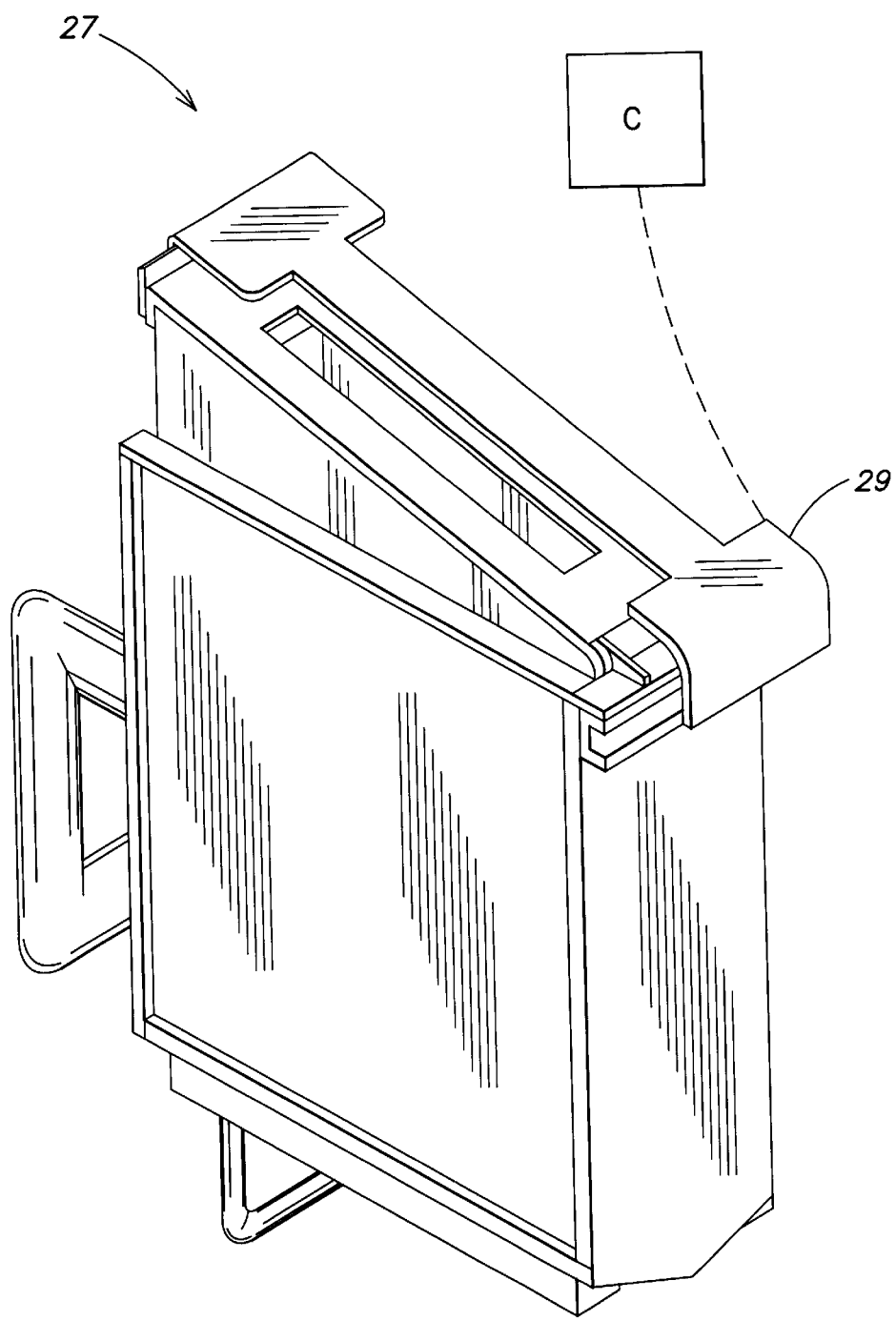
FIG. 3 is a perspective view of a chamber that may contain the scrubber device.

FIG. 3 is a perspective view of a chamber 27 that may contain the scrubber device 11 (FIG. 2). The chamber 27 may comprise an enclosure door 29 as shown in FIG. 2. A controller C (FIG. 2) is adapted to couple to the enclosure door 29, to the motors M1 and M2, the pivotal mounting 18, and to the spray nozzles 21. The controller C controls the operation of the scrubber device 11 as described below. Specifically, the controller C comprises a program stored therein and adapted to perform the inventive scrubbing method.

Figure 4:
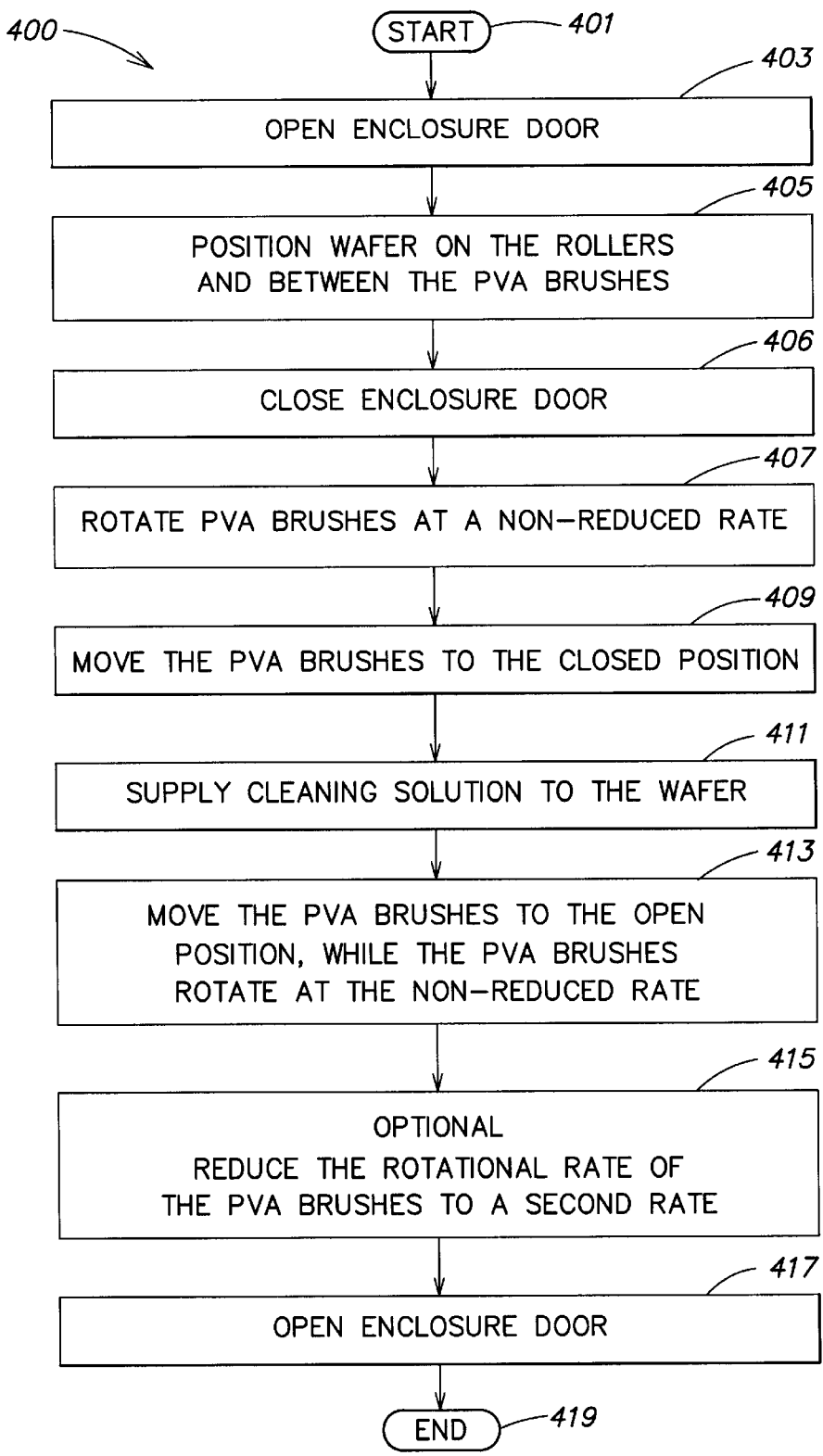
FIG. 4 is a flowchart of an inventive scrubbing method that may be performed in any conventional scrubber device, but which is described with reference to the inventive scrubber device of FIG. 2.

FIG. 4 is a flowchart of an inventive scrubbing method 400 that may be performed in any conventional double sided scrubber device, but which is described with reference to the inventive scrubbing device 11 of FIG. 2. Referring to the flowchart of FIG. 4, the inventive scrubbing method 400 starts at step 401. The inventive scrubbing method 400 may operate according to the following process. The PVA brushes 13a, 13b are initially in an open position (not shown), a sufficient distance from each other so as to allow a wafer W to be inserted therebetween. The initial rotational rate of the PVA brushes 13a, 13b may vary as described below. For example, the initial rotational rate of the PVA brushes 13a, 13b may be either zero, a slow rate (e.g., 120 rpm), or a first rate (e.g., 400 rpm).

In step 403, the enclosure door 29 opens so that the wafer W may be placed into the chamber 27. Thereafter in step 405, the wafer W to be cleaned is positioned on the rollers 19a c between the PVA brushes 13a, 13b. In step 406, the enclosure door 29 closes so as to prevent fluid from spraying outside the scrubber device 11. In step 407, the motor M1 is engaged and the rotational rate of the PVA brushes 13a, 13b may increase from the slow rate to the first rate. Alternatively, depending on the initial rotational rate of the PVA brushes 13a, 13b, the PVA brushes 13a, 13b may begin to rotate at the first rate or may continue to rotate at the first rate in step 407. In one aspect, the PVA brushes 13a, 13b may rotate in opposite directions so that, when in contact with the wafer W, they force the wafer W toward the rollers such that the wafer W is rotated either clockwise or counterclockwise via the rollers 19a–c.

In step 409, the PVA brushes 13a, 13b assume a closed position, sufficiently close to each other so as to both hold the wafer W in place therebetween and to exert a force on the wafer surfaces sufficient to achieve effective cleaning. It will be understood that steps 407–409 may be reversed and the scrubber brushes may begin rotating at a desired rate after they contact the wafer W. In one aspect, the PVA brushes 13a, 13b rotate only at the first rate when in contact with the wafer W.

In step 411, as the PVA brushes 13a, 13b rotate, a fluid such as deionized water or a cleaning solution may be supplied to the wafer W via the spray nozzles 21 and/or through the scrubber brushes 13a, 13b so as to aid in the removal of slurry residue. In one aspect, during wafer scrubbing, a continuous supply of fresh fluid is sprayed on the wafer W at a controlled rate so as to continuously rinse slurry residue from the wafer W. The wafer W is cleaned by the frictional and drag forces generated between the rotating PVA brushes 13a, 13b, and by the cleaning/rinsing action of the fluid.

In step 413, after the wafer W is cleaned, the controller C opens the PVA brushes 13a, 13b, thereby removing the PVA brushes 13a, 13b from contact with the wafer W, while the PVA brushes 13a, 13b rotate at the non-reduced rate. As previously stated, in one aspect, the PVA brushes 13a, 13b may rotate at the same rate (e.g., the first rate) whenever the PVA brushes 13a, 13b are in contact with the wafer W.

After both PVA brushes 13a, 13b are no longer contacting the wafer W, the controller C optionally slows the rotational rate of the PVA brushes 13a, 13b to a slow rate in step 415. Alternatively, the controller C may maintain the non reduced rate of the PVA brushes 13a, 13b or may optionally slow the rotational rate of the PVA brushes 13a, 13b to zero. The slow rate may be sufficiently reduced so as to reduce and eliminate instances of fluid spray/splashing outwardly from the PVA brushes 13a, 13b (e.g., due to centripetal force). The reduced rate may thus prevent fluid from spraying outside the chamber 27 when the enclosure door 29 opens. When the rotational rate of the PVA brushes 13a, 13b has optionally been reduced to the slow rate or to zero, or simultaneously as the rate is reduced, the controller C may open the enclosure door 29 of the chamber 27, which allows a wafer handler's end effector (not shown) to enter therethrough and extract the clean wafer W (step 417). Likewise, in aspects that do not reduce the rotational rate of the PVA brushes 13a, 13b, the controller C may open the enclosure door 29 of the chamber 27, which allows a wafer handler's end effector (not shown) to enter therethrough and extract the clean wafer W (step 417). Thereafter, in step 419, the process ends.

The inventive method and apparatus may reduce the instances of streaking, spotting and particle accumulation experienced by wafers cleaned within a scrubber device that operates in accordance with the invention. The inventive method and apparatus therefore must repeatedly provide cleaner wafer surfaces, and proven particularly beneficial for cleaning wafers when an acidic solution is employed (e.g., such as when wafers having hydrophobic low-k and/or copper layers deposited thereon are cleaned). It is believed that the inventive method may work equally well for any cleaning solution. For example, the inventive method may work with a cleaning solution in which brushes, substrates and/or particles to be cleaned from the substrates have a highly negative zeta potential (e.g., less than '20 mV) as well as with a cleaning solution in which brushes, substrates and/or particles to be cleaned from the substrates have a slightly negative or a positive zeta potential (e.g., greater than −20 mV). It will be understood that even if either steps 107-109, or steps 407-409, are reversed (such that the scrubber brushes contact the wafer before their rotational speed is increased), the inventive method may still reduce the instances of streaking, spotting and particle accumulation experienced by wafers cleaned via the inventive method. Further, although the embodiments of FIGS. 1 and 4 include the opening and closing of the scrubber chamber door, it will be understood that these steps are merely preferred, and that other methods may not employ an enclosure. Accordingly, the opening and closing of a chamber door is not required in all aspects of the invention.

The foregoing description discloses only the preferred embodiments of the invention, modifications of the above-disclosed apparatus and method which fall within the scope of the invention will be readily apparent to those of ordinary skill in the art. For instance, the method and the control program of the present invention may be used with any type of wafer scrubber such as those employing roller or pancake type brushes made of polyvinyl acetate (PVA), or other porous or sponge-like materials, brushes made from nylon bristles, mohair or similar materials, regardless of wafer orientation (e.g. horizontal, vertical, etc.) and whether single or double sided scrubbers are employed. The inventive method may also be employed with brushes adapted to scrub the edge of a wafer. When employed with a stationary brush (e.g., a brush that does not rotate, but instead relies on the rotation of the wafer), the stationary brush is removed from contact with a wafer, before the wafer's rotational speed is slowed. The rotational rate of the scrubber brush may vary depending on numerous factors, such as the size of the scrubber brush, the type of scrubber brush, the number of scrubber brushes, and the properties (e.g., zeta potential, etc.) of the particles being removed from the wafer's surface, etc.

Accordingly, while the present invention has been disclosed in connection with the preferred embodiments thereof, it should be understood that other embodiments may fall within the spirit and scope of the invention, as defined by the following claims.

The invention claimed is:

1. A method of cleaning a wafer, the method comprising:
rotating a scrubber brush at a first rate, while the scrubber brush is in contact with the wafer;
removing the scrubber brush from contact with the wafer while rotating the scrubber brush at the first rate; and
slowing the scrubber brush rotation to a second rate that is slower than the first rate after removing the scrubber brush from contact with the wafer;
wherein the first rate is a rate employed to clean the wafer.

2. The method of claim 1 further comprising:
increasing a rotational rate of the scrubber brush to the first rate before the scrubber brush contacts the wafer.

3. The method of claim 1 wherein the first rate is approximately 400 rpm.

4. The method of claim 3 wherein slowing the scrubber brush rotation to a second rate comprises slowing a rotational rate of the scrubber brush from approximately 400 rpm to approximately 120 rpm.

5. The method of claim 1 further comprising:
rotating the scrubber brush at the first rate before the scrubber brush contacts the wafer.

6. The method of claim 1 further comprising:

directing a cleaning solution toward a wafer while rotating the scrubber brush at the first rate and while the scrubber brush is in contact with the wafer.

7. The method of claim 6 wherein the cleaning solution comprises an acidic cleaning solution.

8. The method of claim 6 wherein the cleaning solution causes the scrubber brush, the wafer and particles to be cleaned from the wafer have a zeta potential of less than or equal to about negative 20 mV.

9. The method of claim 6 wherein the cleaning solution causes the scrubber brush, the wafer and particles to be cleaned from the wafer have a zeta potential of greater than about negative 20 mV.

10. The method of claim 1 further comprising:

containing the scrubber brush and the wafer contacted thereby within a chamber having a door; and opening the door of the chamber after slowing a rotational rate of the scrubber brush.

11. The method of claim 1 wherein rotating a scrubber brush at a first rate, while the scrubber brush is in contact with the wafer comprises rotating a scrubber brush only at a first rate, while the scrubber brush is in contact with the wafer.

12. The method of claim 1 further comprising:

containing the scrubber brush and the wafer contacted thereby within a chamber having door;

opening the door of the chamber; and slowing the scrubber brush to the second rate after the scrubber brush is removed from contact with the wafer but before the chamber door is opened.

13. A method of cleaning a wafer, the method comprising:

providing a scrubber brush adapted to scrub a wafer;

rotating the scrubber brush at a non-reduced rate, while the scrubber brush is in contact with the wafer;

removing the scrubber brush from contact with the wafer while rotating the scrubber brush at the non-reduced rate; and slowing the scrubber brush rotation to a second rate after removing the scrubber brush from contact with the wafer;

wherein the non-reduced rate is a rate employed to clean the wafer.

14. The method of claim 13 further comprising:

increasing a rotational rate of the scrubber brush to the non-reduced rate before the scrubber brush contacts the wafer.

15. The method of claim 13 wherein rotating a scrubber brush at a non-reduced rate, while the scrubber brush is in contact with the wafer comprises rotating a scrubber brush only at a non-reduced rate, while the scrubber brush is in contact with the wafer.

* * * * *